(12) United States Patent
Van Dam et al.

(10) Patent No.: US 7,028,954 B2
(45) Date of Patent: Apr. 18, 2006

(54) MICROFABRICATED TRANSLATIONAL STAGES FOR CONTROL OF AERODYNAMIC LOADING

(75) Inventors: Cornelis P. Van Dam, Davis, CA (US); Dora T. Yen, Dublin, CA (US); Rosemary L. Smith, Davis, CA (US); Scott D. Collins, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/405,889

(22) Filed: Apr. 1, 2003

(65) Prior Publication Data
US 2003/0218102 A1 Nov. 27, 2003

Related U.S. Application Data

(63) Continuation of application No. PCT/US01/31667, filed on Oct. 9, 2001.
(60) Provisional application No. 60/239,427, filed on Oct. 10, 2000.

(51) Int. Cl.
*B64C 21/10* (2006.01)
(52) U.S. Cl. .................................................. 244/204
(58) Field of Classification Search ............... 244/198, 244/201, 204, 35 R, 199, 130, 207, 34 R, 244/213, 215, 158 R
See application file for complete search history.

(56) References Cited

U.S. PATENT DOCUMENTS

| | | | |
|---|---|---|---|
| 2,821,352 A * | 1/1958 | Phillips | 244/90 A |
| 2,929,582 A | 3/1960 | Munro | |
| 2,951,662 A * | 9/1960 | Theodorsen | 244/207 |
| 3,191,887 A | 6/1965 | Ikai et al. | |
| 3,318,555 A * | 5/1967 | Swogger et al. | 244/90 A |
| 4,039,161 A * | 8/1977 | Bauer | 244/213 |
| 5,205,519 A | 4/1993 | Creel | |
| 5,755,408 A * | 5/1998 | Schmidt et al. | 244/204 |
| 6,302,360 B1 | 10/2001 | Ng | |
| 6,427,948 B1 * | 8/2002 | Campbell | 244/199 |
| 6,484,971 B1 * | 11/2002 | Layukallo | 244/130 |
| 6,641,089 B1 * | 11/2003 | Schwetzler et al. | 244/198 |

FOREIGN PATENT DOCUMENTS

DE 39 13 678 CA 7/1990

OTHER PUBLICATIONS

Copy of International Search Report from PCT International Application No. PCT/US01/31667, pp. 1 thru 5, Jul. 2, 2002.

* cited by examiner

*Primary Examiner*—Peter M. Poon
*Assistant Examiner*—Timothy D. Collins
(74) *Attorney, Agent, or Firm*—John P. O'Banion

(57) ABSTRACT

Micro-electro-mechanical (MEM) translational tabs are introduced for enhancing and controlling aerodynamic loading of lifting surfaces. These microtabs are mounted at or near the trailing edge of lifting surfaces, deploy approximately normal to the surface, and have a maximum deployment height on the order of the boundary layer thickness. Deployment of this type of device effectively changes the camber, thereby affecting the lift generated by the surface. The effect of these microtabs on lift is as powerful as conventional control surfaces such as ailerons. Application of this simple yet innovative lift enhancement and control device will permit the elimination of some of the bulky conventional high-lift and control systems and result in an overall reduction in system weight, complexity and cost.

82 Claims, 12 Drawing Sheets

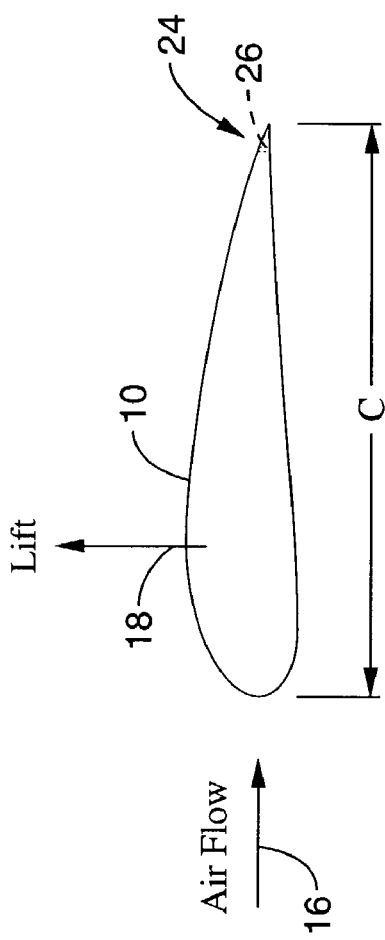
FIG. 3
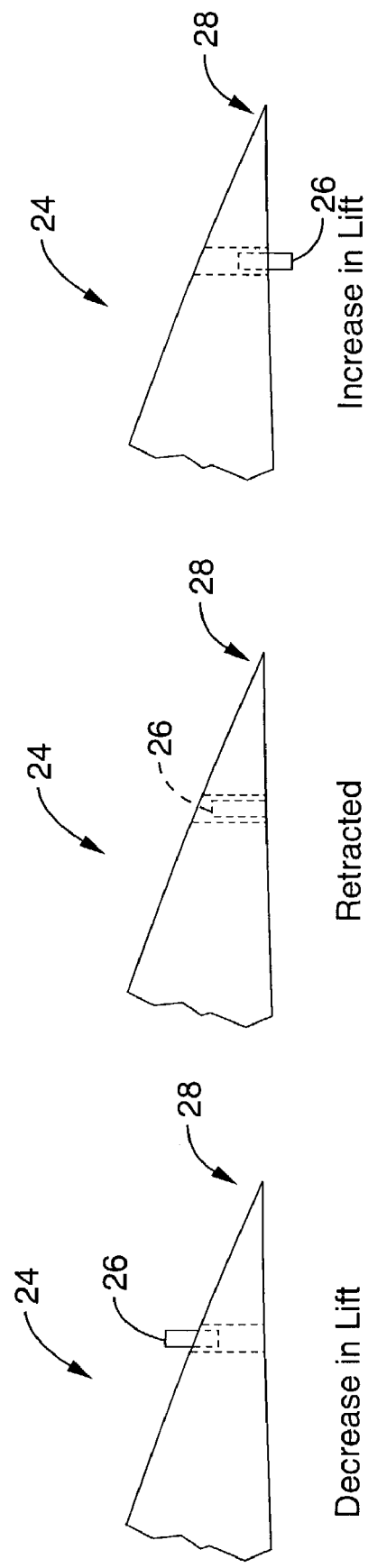
FIG. 6 Increase in Lift
FIG. 5 Retracted
FIG. 4 Decrease in Lift

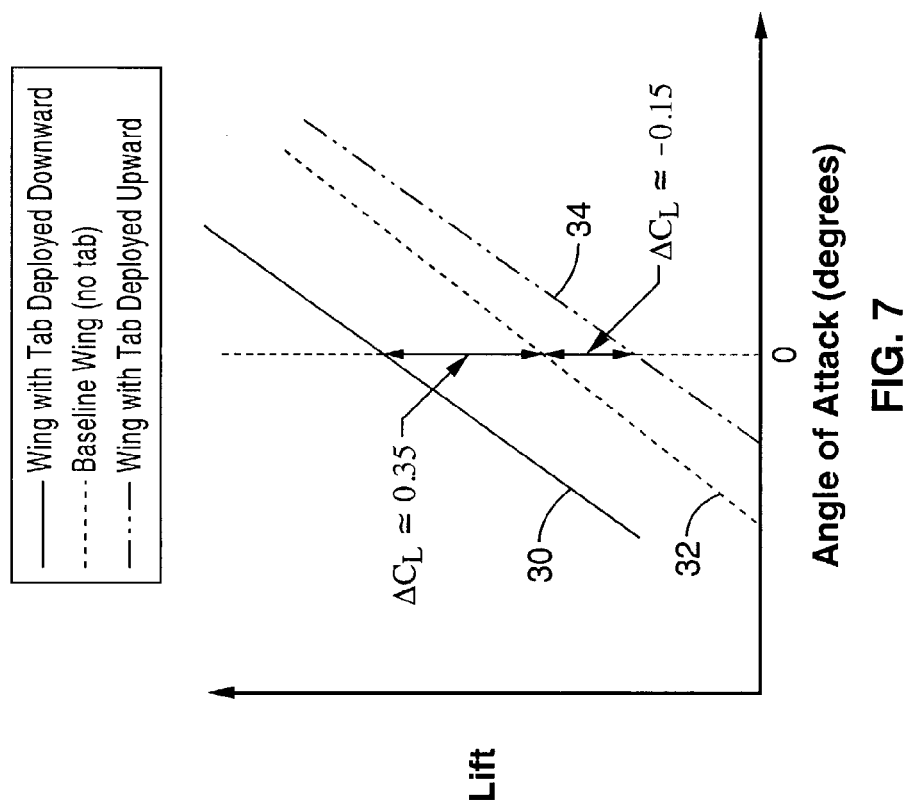

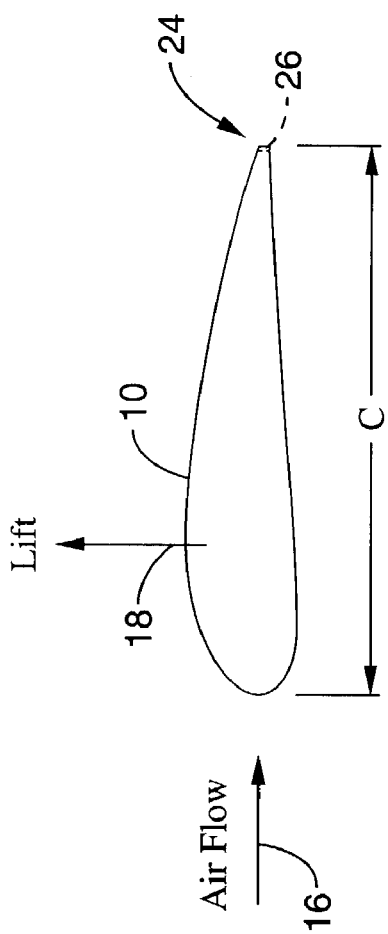
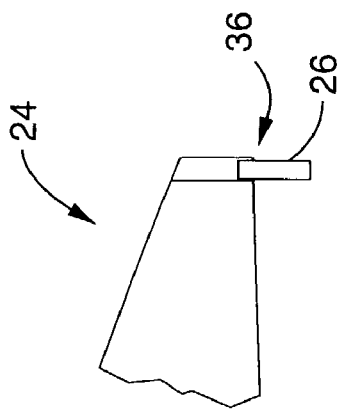
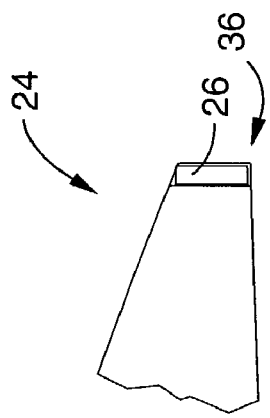
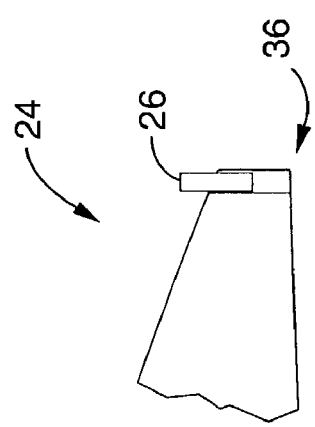
FIG. 8
FIG. 11 Increase in Lift
FIG. 10 Retracted
FIG. 9 Decrease in Lift

MICROFABRICATED TRANSLATIONAL STAGES FOR CONTROL OF AERODYNAMIC LOADING

CROSS-REFERENCE TO RELATED APPLICATIONS

This application claims priority from, and is a 35 U.S.C. §111(a) continuation of, co-pending PCT international application serial number PCT/US01/31667 filed on Oct. 9, 2001 which designates the U.S. and which claims priority from U.S. provisional application Ser. No. 60/239,427 filed on Oct. 10, 2000, incorporated herein by reference.

STATEMENT REGARDING FEDERALLY SPONSORED RESEARCH OR DEVELOPMENT

Not Applicable

INCORPORATION-BY-REFERENCE OF MATERIAL SUBMITTED ON A COMPACT DISC

Not Applicable

NOTICE OF MATERIAL SUBJECT TO COPYRIGHT PROTECTION

A portion of the material in this patent document is subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. §1.14.

BACKGROUND OF THE INVENTION

1. Field of the Invention

This invention pertains generally to aerodynamic load control devices, and more particular to a translational device for controlling lift of an airfoil.

2. Description of Related Art

Aerodynamic load control devices are common on lifting surfaces on airplanes, rotorcraft, wind turbines and other lift generating systems. In an airplane, an aileron is a typical aerodynamic control device used to change the lift and drag properties of the airfoil. Despite their lift enhancement properties, however, conventional aileron devices tend to be bulky and heavy and often require complex systems for actuation and support. Also, these devices are prone to flutter and as a result require special attention in the design and development stage. In addition, conventional devices tend to require intensive and costly maintenance throughout the lifespan of the system.

A conventional control surface or simple flap is a separate moveable lifting surface that typically occupies the aft 20% to 30% of the chord of a lifting surface.

As illustrated in FIG. 1, in a conventional airfoil 10, rotating the control surface or flap 12 about its hinge point 14 results in a change in surface camber which in turn causes a change in the circulation of the air flow 16 and, thus, the lift 18 of the entire lifting surface. For example, raising flap 12 to position 20 will cause a decrease in lift, while lowering flap 12 to position 22 will cause an increase in lift. It is well known that the optimum location for subsonic lift control in aircraft is at the trailing edge of an airfoil since small changes in the flow field near the trailing edge can result in large changes in the overall flow field. The trailing-edge geometry of a lifting airfoil or surface has a significant influence on the aerodynamic performance of the airfoil at subsonic and transonic flow conditions.

One example of small changes in the flow field near the trailing edge creating large changes in the overall flow field is the trailing-edge blowing concept. Here, large increases in lift are obtainable when tangential surface blowing occurs over a rounded trailing edge. This pneumatic concept can greatly simplify high-lift system complexity and also replace the control surfaces on aircraft. The major problems with this concept are 1) the complexity, weight, and cost associated with the piping of substantial amounts of high-pressure air, (2) the increase in engine size and, hence, weight and cost, necessitated by the loss in engine mass flow for the pneumatic system, or the need for pumps (many small ones or one or two large ones) to generate the required mass flow, and (3) the problem of making this concept reliable and failsafe; i.e., a loss in engine power or an engine failure should not result in a loss of airplane control.

Instead of trailing-edge blowing, it may be easier to deploy a small trailing-edge flap for lift control. An example of such a device is a "Gurney-flap" which consists of a small (approximately 0.01×airfoil-chord), fixed vertical tab mounted perpendicular to the lower (pressure) surface at the trailing edge. FIG. 2 shows the relationship between the coefficient of lift, $C_L$, and angle of attack, $\alpha$, for a 0.125c Gurney-flap in comparison to a clean airfoil. While Gurney-flaps enhance lift in the linear range as shown in FIG. 2, they may also cause a significant drag penalty especially at low lift conditions, such as cruise flight. This drag penalty is the main reason why Gurney-flaps are used on only a few aircraft configurations for which high maximum lift is more important than low cruise drag. To avoid the drag penalty, miniature split flaps hinged to the airfoil lower surface have been conceptualized. While these split flaps would be stowed during cruise so as to eliminate drag, their implementation has been hampered by the fact that the aft portion of an airfoil with a sharp trailing edge does not provide sufficient structural support or volume for hinges and deployment hardware based on conventional manufacturing technology.

BRIEF SUMMARY OF THE INVENTION

In accordance with the present invention, the foregoing problems are solved by using small, tab-like, translational elements that are imbedded in the trailing-edge region of the airfoil. When activated, the translational elements deploy outward and have a maximum height of a few percent of the chord length of the airfoil. Downward deflection augments airfoil camber and, hence, lift, whereas upward deflection decreases lift. The effect of these translational elements on lift is as powerful as a conventional flight control surface such as an aileron.

By way of example, and not of limitation, a plurality of actively controlled micro-electro-mechanical (MEM) translational elements are installed in the trailing edge region of lifting surfaces. These MEMs tabs are small (e.g., approximately 1% of chord), are robust and versatile, can range anywhere from microns to centimeters in width, and can extend in length up to several millimeters which is on the order of the boundary layer thickness. In one embodiment, the translational elements are mounted forward of a "sharp" or tapered trailing edge of the airfoil, deploy normal to the surface, and are designed to both extend and retract. In an alternative embodiment, the translational elements are mounted at edge of a blunt trailing edge. Deployment of this type of device in either configuration modifies the camber distribution of the airfoil section, and hence the lift generated.

Application of this rather simple but innovative lift control system based on microfabrication techniques will permit the elimination of conventional control systems and, hence, result in a significant reduction in weight, complexity, and cost. Also due to the miniature size of these tabs, their activation and response times are expected to be much faster than that of conventional trailing edge devices. Further objects and advantages of the invention will be brought out in the following portions of the specification, wherein the detailed description is for the purpose of fully disclosing preferred embodiments of the invention without placing limitations thereon.

BRIEF DESCRIPTION OF THE SEVERAL VIEWS OF THE DRAWING(S)

The invention will be more fully understood by reference to the following drawings which are for illustrative purposes only:

FIG. 3 is a schematic side view of an airfoil employing a translational aerodynamic load control device according to the present invention forward of the trailing edge.

FIG. 4 is a detailed schematic view of the translational element of FIG. 3 shown extended upward to decrease lift.

FIG. 5 is a detailed schematic view of the translational element of FIG. 3 shown retracted for cruise.

FIG. 6 is a detailed schematic view of the translational element of FIG. 3 shown extended downward to increase lift.

FIG. 7 is a graph showing the relationship between the coefficient of lift and angle of attack corresponding to the positions of the translational element shown in FIG. 4 through FIG. 6.

FIG. 8 is a schematic side view of an alternative embodiment of an airfoil employing a translational aerodynamic load control device where the translational elements are installed at the blunt trailing edge according to the invention.

FIG. 9 is a detailed schematic view of the translational element of FIG. 8 shown extended upward to decrease lift.

FIG. 10 is a detailed schematic view of the translational element of FIG. 8 shown retracted for cruise.

FIG. 11 is a detailed schematic view of the translational element of FIG. 8 shown extended downward to increase lift.

DETAILED DESCRIPTION OF THE INVENTION

Figure 1:
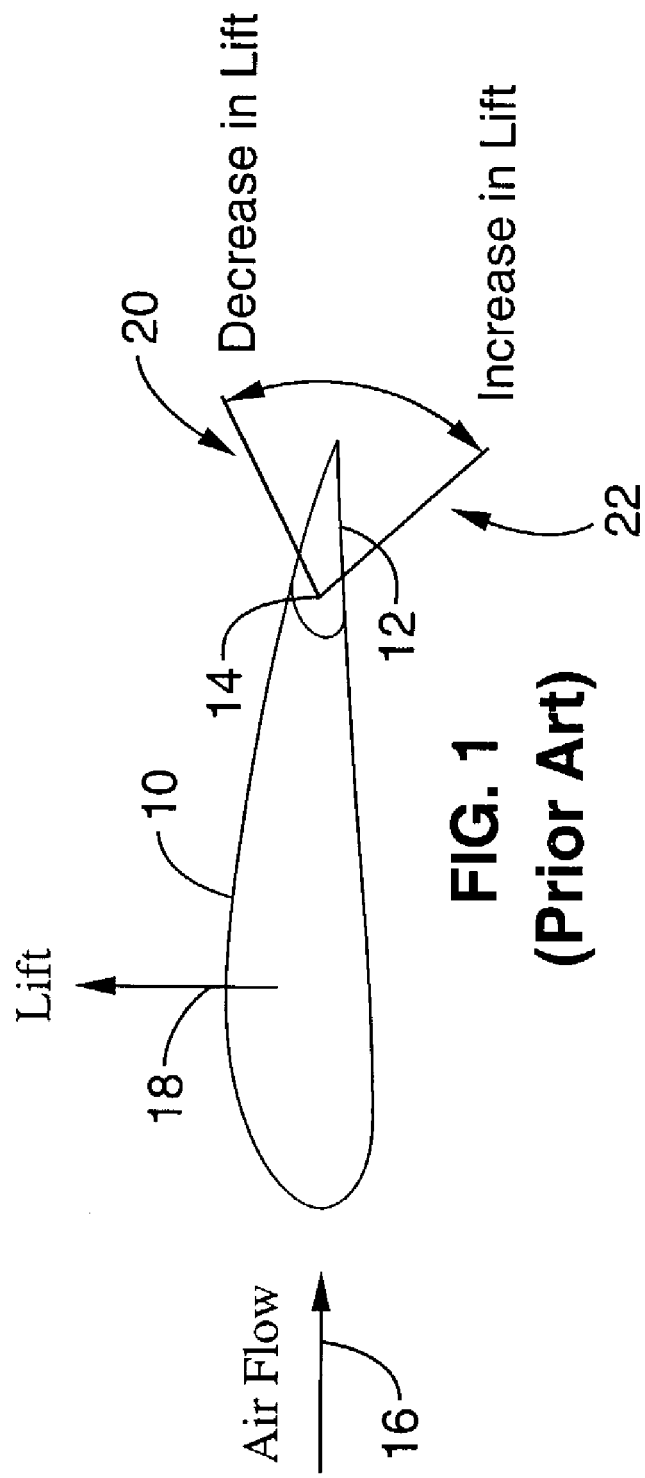
FIG. 1 is schematic side view of an airfoil employing a conventional aerodynamic load control device illustrating the movement of an aileron for increasing and decreasing lift.
Figure 2:
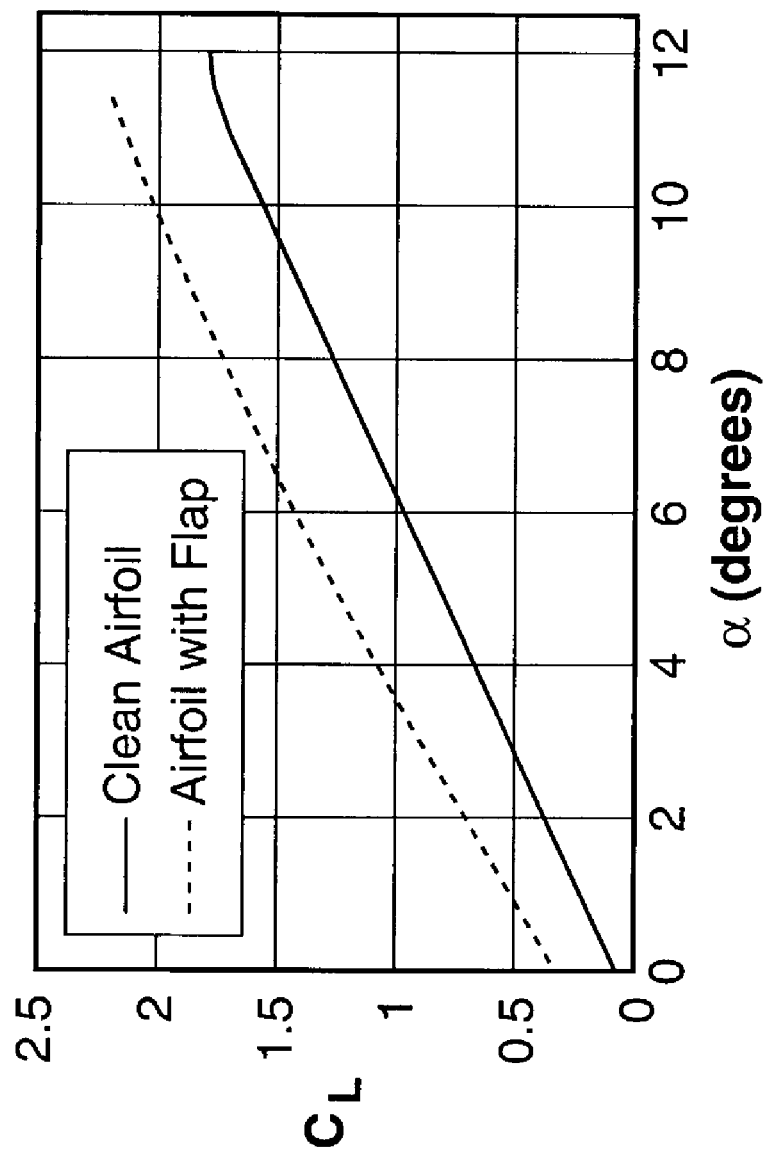
FIG. 2 is a graph showing the relationship between coefficient of lift, $C_L$, and angle of attack, $\alpha$, for a 0.125c Gurney-flap in comparison to a clean airfoil.

Referring more specifically to the drawings, for illustrative purposes the present invention is embodied in the apparatus and methods generally shown in FIG. 3 through FIG. 23. It will be appreciated that the apparatus may vary as to configuration and as to details of the parts, and that the method may vary as to the specific steps and sequence, without departing from the basic concepts as disclosed herein.

Referring first to FIG. 3, in accordance with the present invention a plurality of translational elements are installed in the trailing-edge region 24 of lifting surfaces of airfoil 10 for load control instead of conventional control systems. FIG. 4 through FIG. 6 depict such a configuration. In FIG. 4, one such translational element (tab) 26 is shown in an upward extended position to cause a decrease in lift. In FIG. 5 translational element 26 is shown in a fully retracted position which would be the case during aircraft cruise conditions. In FIG. 6, translational element 26 is shown in a downward extended position to cause an increase in lift. The amount of extension of translational element 26 can be variable or extension can be controlled to simply be "on/off".

Referring also to FIG. 7, the effect of these translational elements on lift is shown to be as powerful as a conventional flight control surface. FIG. 7 shows the relationship between the lift coefficient, $C_L$, and angle of attack where:

$$C_L = \frac{\text{Lift}}{\frac{1}{2}\rho v^2 S},$$

$\rho$ = fluid density, $v$ = flow velocity, and $S$ = platform area of wing.

for translational element with a height of 0.01 c and position of 0.05 c forward of the trailing edge, wherein c=chord. Line 30 shows the characteristics with the translational element deployed downward, line 32 shows the characteristics with the translational element retracted, and line 34 depicts the characteristics with the translational element deployed upward. As can be seen, a translation element with a height of one percent of the chord deployed downward near the trailing edge is demonstrated to increase the lift at zero angle of attack by approximately 35%.

Note in FIG. 3 through FIG. 6 that airfoil 10 employs a tapered or sharp trailing edge 28 and that the translational elements are positioned forward of the trailing edge 28. Alternatively, airfoil 10 could employ a blunt trailing edge 36 as shown in FIG. 8 through FIG. 11. In FIG. 9, translational element 26 is shown in an upward extended position to cause a decrease in lift. In FIG. 10 translational element 26 is shown in a fully retracted position which would be the case during aircraft cruise conditions. In FIG. 11, translational element 26 is shown in a downward extended position to cause an increase in lift.

It will be appreciated that the specific implementation of the translational elements will vary with the scale of the lifting surface. For example, one embodiment involves the application of micro-electro-mechanical systems (MEMS) technology. In accordance with this embodiment, a plurality of such translational elements would be fabricated in silicon using anisotropic etching and produced in predefined arrays of arbitrary geometry. Each element within an array could be individually actuated to produce a variable trailing-edge geometry for the lifting surface. Furthermore, use of a serrated pattern for the trailing-edge geometry may have a beneficial effect on the performance characteristics of the lifting surface. The translation elements can be actuated mechanically and/or magnetically using known techniques. When activated, the translational elements deploy outward; that is, they attain an extended position. Downward extension augments airfoil camber and, hence, lift whereas upward extension decreases lift. The size of each translational element can range anywhere from microns to centimeters in width and extension with thicknesses up to several millimeters.

Figure 13:
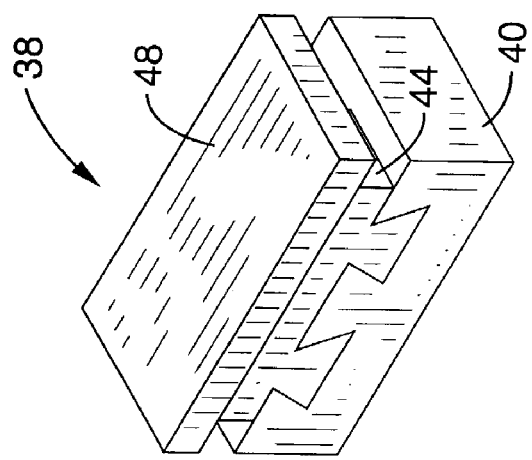
FIG. 13 is an assembled view of the translational stage shown in FIG. 12.
Figure 12:
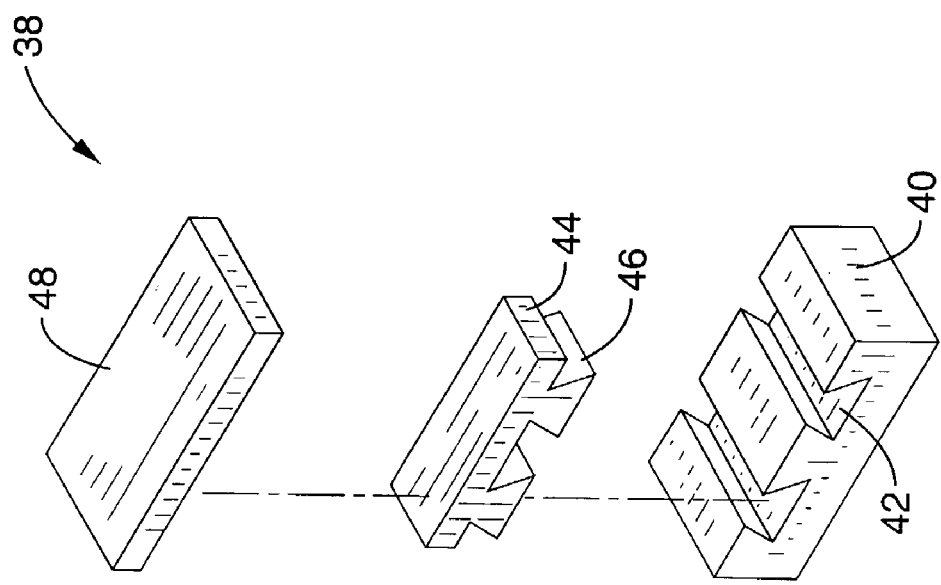
FIG. 12 is an exploded schematic view of a translational stage according to the present invention.

Preferably, translational element 26 comprises a sliding component in a "dovetail" microfabricated translational stage 38 having the configuration shown in FIG. 12 and FIG. 13. The translational stage shown in FIG. 12 and FIG. 13 comprises a base 40 having a plurality of dovetail-shaped receptacles 42, a slider 44 having a plurality of dovetail-shaped fingers 46 that slidably mate with receptacles 42, and an extender 48 that is coupled to slider 44. To assemble the translational stage, extender 48 is bonded to slider 44 using a conventional bonding technique and fingers 46 are slidably inserted into receptacles 42. The dovetail joint configuration provides a natural interlock to prevent slider 44 and extender 48, which together form translational element 26, from falling out of base 40.

Figure 14:
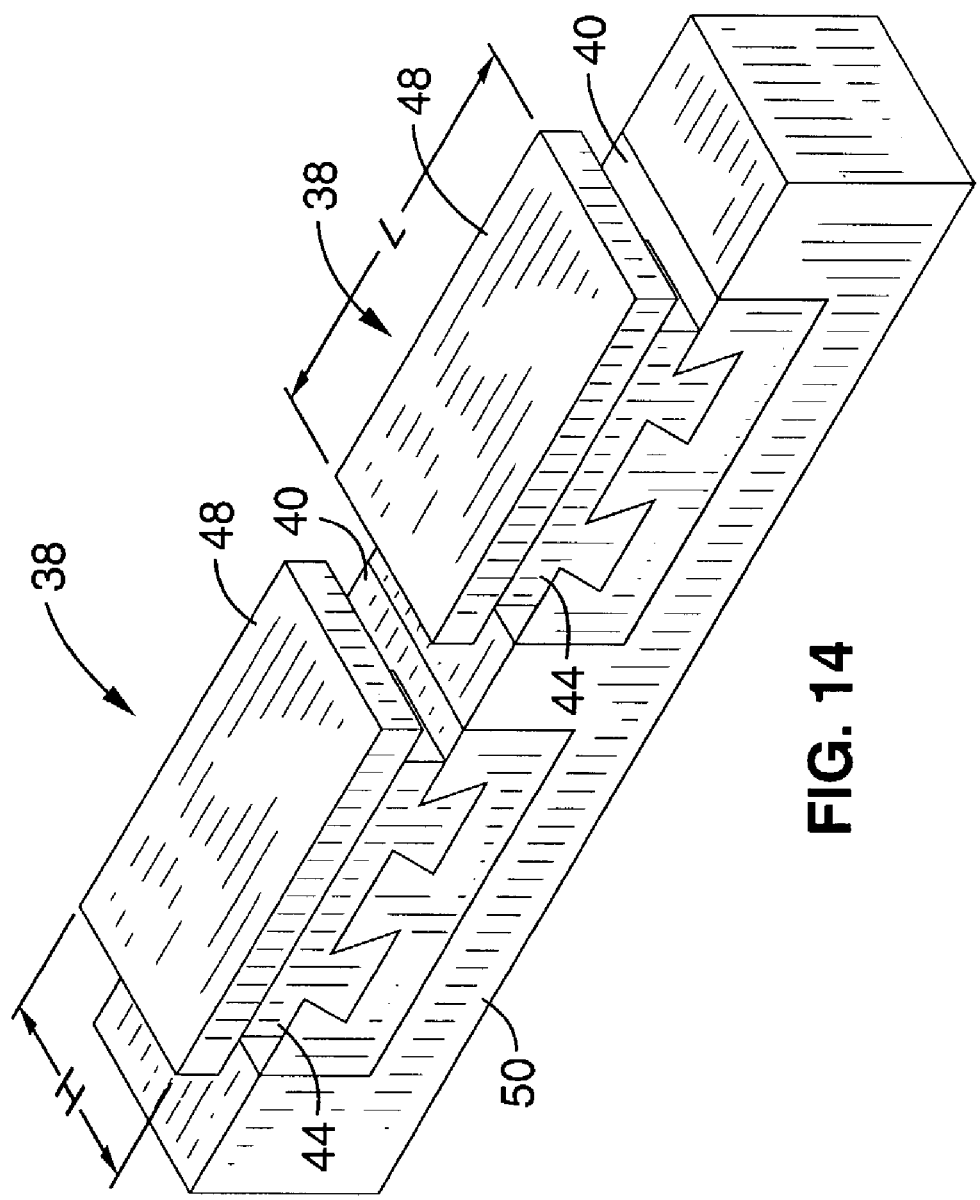
FIG. 14 is a schematic view of a two element array of translational stages shown in FIG. 13.
Figure 15:
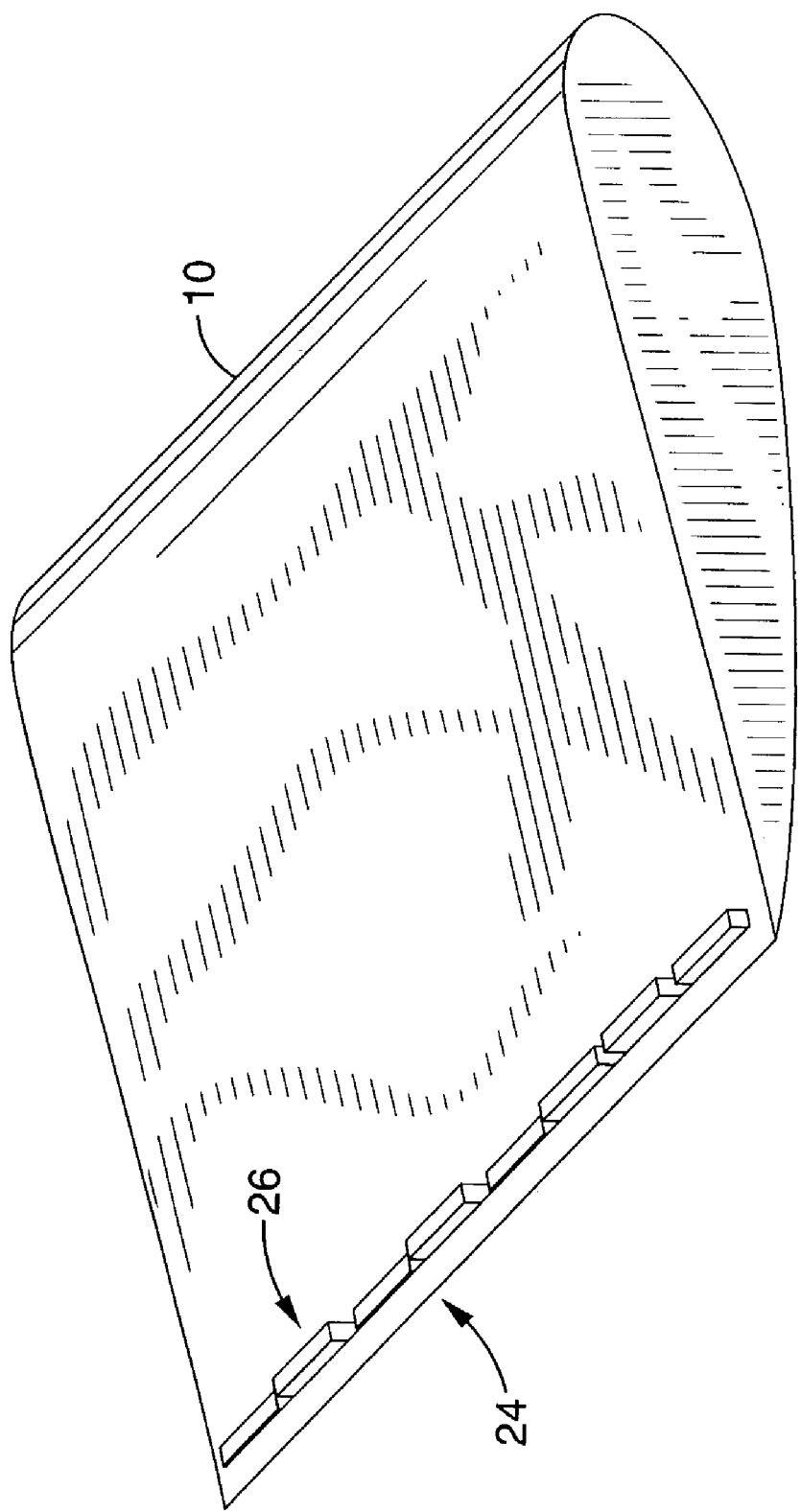
FIG. 15 is a perspective schematic view of the underside of an airfoil with an eight element linear array of translational stages shown in FIG. 13.
Figure 17:
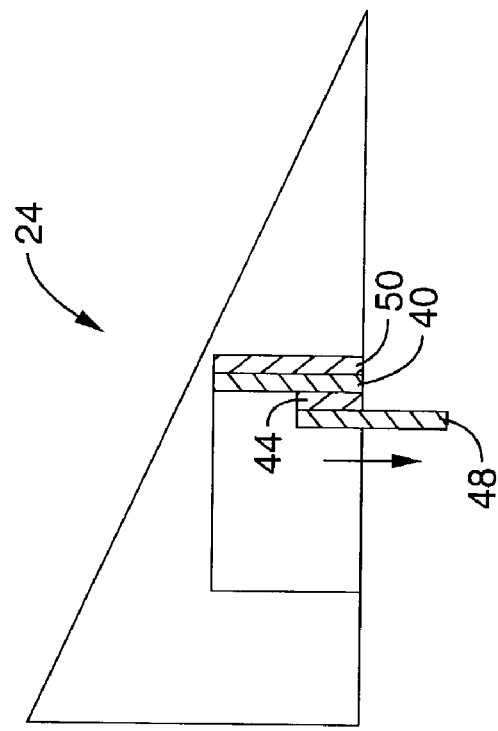
FIG. 17 is a schematic side view in cross-section of the trailing edge portion of an airfoil showing a translational stage of FIG. 14 in the extended position.
Figure 16:
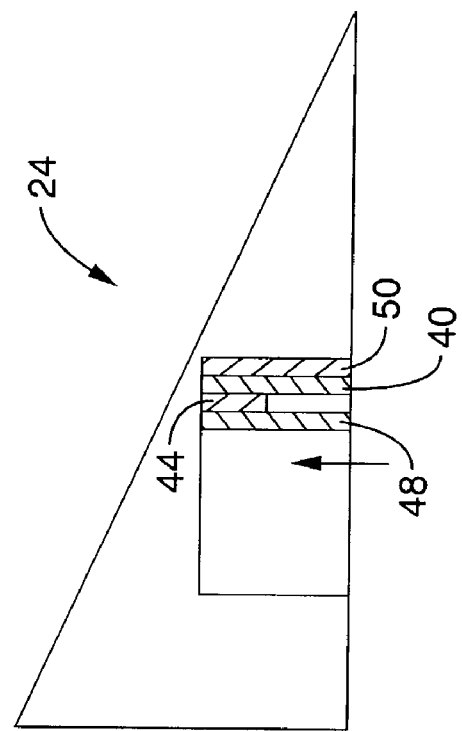
FIG. 16 is a schematic side view in cross-section of the trailing edge portion of an airfoil showing a translational stage of FIG. 14 in the retracted position.

For use with an airfoil, a plurality of translational stages 38 are arranged into a linear array by bonding the stages to a support member 50 as shown in FIG. 14, thereby forming a modular track. FIG. 15 shows an example of a portion of an airfoil with an array of eight translational stages. Approximately thirty stages are needed to cover a 3-foot airfoil section where the length, height and width of each assembly are approximately 20 mm×5 mm×1.2 mm, respectively. Note also that FIG. 15 illustrates that translational elements 26 can be individually controllable. Each translational stage can be retracted as shown in FIG. 16 or extended as shown in FIG. 17.

Dovetail translational stages of various sizes can be easily fabricated in this manner ranging in width length from, for example, 100 µm to 12 cm. To be used as a lift control device for an airfoil, an extender translation distance should be on the order of a few millimeters on small chord sections with larger sections requiring a proportional increase in actuation distances. While typical translation limits for conventional MEMs devices are at best a few hundred microns, one of the primary advantages of the dovetail translational stages used here is their relatively large translational capability. In addition, the joint design allows for "packaging" in the small space at the trailing edge of airfoils. This structure thus provides a simple, interconnecting, sliding assembly that is small and lightweight. By using microfabrication techniques, these "microtab" type translational elements can be designed and sized to fit the aerodynamic application.

Figure 18D:
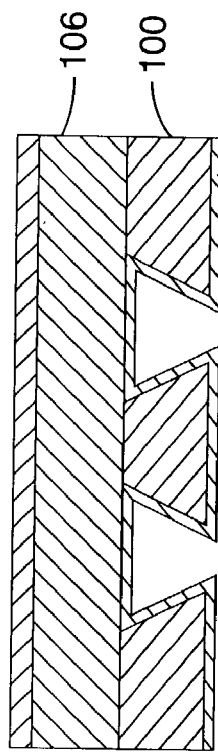
FIGS. 18A through 18E is a flow diagram showing an example of steps employed in the fabrication of the translational stage shown in FIG. 12 and FIG. 13.
Figure 18E:
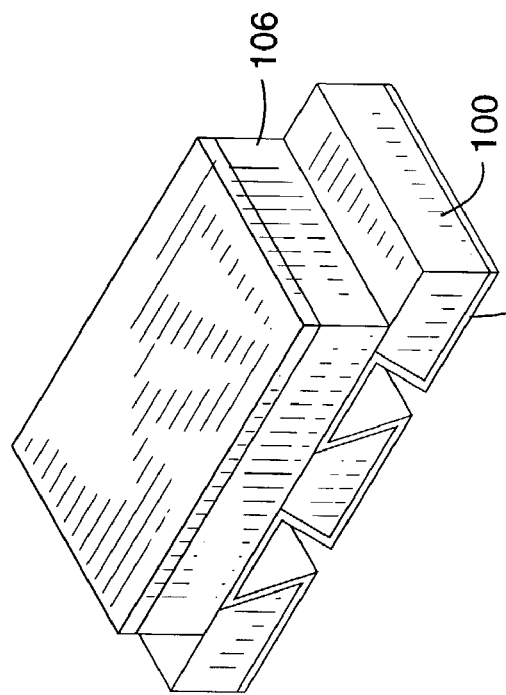
Figure 18A:
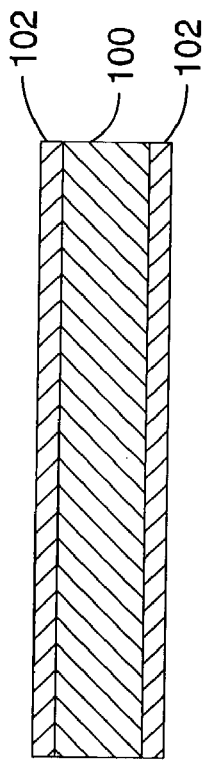
Figure 18B:
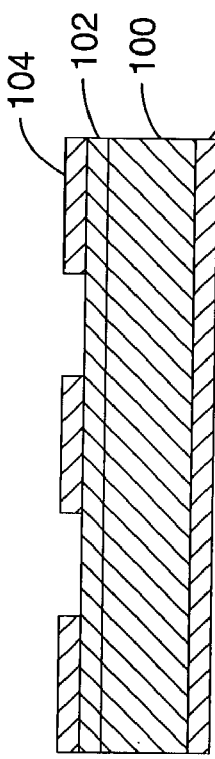
Figure 18C:
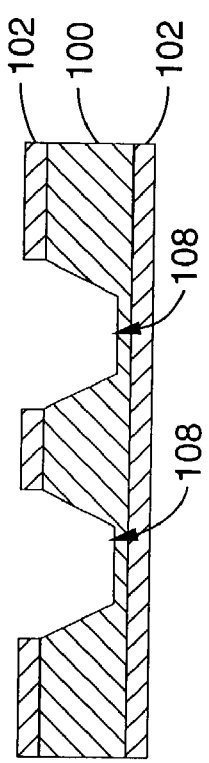

Referring to FIG. 12, FIG. 13 and FIG. 18A together, the translational stages are preferably fabricated on a silicon wafer 100 coated with silicon nitride 102. Conventional chemical etching techniques are used to readily produce the translational stages in predefined arrays of arbitrary geometry. In a typical fabrication process, a chrome mask with the design pattern is created. Taking into account the silicon crystalline orientation, the mask is patterned and transferred to a silicon wafer as shown in FIG. 18B. Next, as depicted in FIG. 18C, silicon is removed in the areas not covered by the photoresist 104 to form the uniform dovetails with 54.7 degree etch angles. This is accomplished using conventional plasma (RIE) and chemical etching (KOH and HF) processes. As shown in FIG. 18D, the etched wafer is then chemically cleaned and fusion bonded to a separate handle wafer 106, and the bridging portions 108 are removed. A final silicon nitride coat 110 is applied to create a nearly flawless and frictionless surface for the sliding tabs. Base 40 and slider 44 are then diced to size as shown in FIG. 12 and extender 48 is bonded to slider 44 to form an assembly as shown in FIG. 13. While all pieces are fabricated from silicon coated with silicon nitride, it will be appreciated that the design allows for exchange of materials. Careful processing results in dovetails with very smooth and precise interlocking qualities and tolerances of a few microns. Such tolerances are unachievable using conventional machining tools. The dovetail design is also self-cleaning as any dust or dirt would be removed from the tracks. A typical yield for a four-inch wafer is approximately 20–25 assemblies.

Static load tests on the translational stages assemblies show that these structures can withstand normal loads of approximately 1.7 N. Given that silicon nitride has a coefficient of friction of approximately 0.4, target actuation forces necessary to activate these tabs are estimated to be about 0.7 N.

It will be appreciated that actuation of the translational elements is an important aspect of commercial realization of the invention. Actuation methods not only need to be able to extend distances of millimeters but must also be able to supply the necessary activation energy. The MEMS translational stages are simple to actuate, robust, and lightweight. For micro-devices, electrostatic and electromechanical methods are predominant due to the minute size and application compatibility. Using conventional magnetic actuation methods, dovetail devices of the type described can be accelerated to over 100 mm/sec in 10 msec with less than 700 μN of force. Translational distances between one micron and 8 cm can also be achieved. However, while magnetic actuation is easily achievable in a controlled laboratory environment, it may not be practical for commercial commercially. For flight vehicles, pneumatic, hydraulic, and mechanical systems have been the conventional means of actuation. Since conventional flight controls are exposed to much higher loads and harsher conditions they require greater activation energies and tend to be large and heavy. With target voltage limits, cost, space and weight restrictions, piezo-electric, hydraulic and pneumatic devices were not considered. A design requiring compressed air canisters or hydraulic reservoirs was not desired. High power consumption devices were also considered unsuitable.

Various methods of actuation investigated include a mechanical linear actuator, a rod and motor linkage, and a shape memory alloy (SMA) assembly. A number of push-pull linear actuators were assembled to test their feasibility. Although the actuators provided adequate travel distance, the non-linearity in the activation force of the mechanical actuators proved to be a limitation. Also an estimated eight to ten actuators would be needed to drive twenty to thirty translational elements which increases the weight significantly. A mechanical linkage using rods and radio control (R/C) motors appears to be most feasible for initial prototype testing.

With recent development and commercialization of shape memory alloys (SMA), a possible solution is presented using SMA wire. Since these translational elements are "micro" in fabrication and design but are "macro" in performance and effect, it seems fitting that to actuate such a device a combination of mechanical and electrical methods be utilized. A prototype actuation mechanism using SMA wire was been sized to investigate the feasibility of such a method. Based on manufacturer's data, using Flexinol wire of 0.003" diameter, the required extension length is achievable. With some wing construction modifications to incorporate length and heat dissipation requirements of the wires, SMA activation shows promise.

EXAMPLE

A GU25-5(11)-8 airfoil was chosen for testing, although numerous other airfoils could have been chosen as well. The GU25-5(11)-8 was selected for its larger trailing edge volume and nearly flat bottom surface. The thick trailing edge provides the volume needed to retract the translational elements. Also, the nearly flat lower surface makes it easy to install translational elements. The GU25-5(11)-8 airfoil was developed at the University of Glasgow as one of a series of high lift, low-drag airfoils.

Experiments were conducted using three, 12-inch chord, 33.5 inch span test airfoil models. One airfoil was used to perform validation tests and to develop a consistent data set for comparison and correction data. The other two GU-like airfoils were fitted with the translational stages. All experiments were conducted in the UC Davis Wind Tunnel Facility (UCD). The facility houses a low-turbulence wind tunnel with a 3×4 ft cross section and 12 ft in length test section built by AeroLab. Tunnel test speeds range from 5 mph to 160 mph and have a six-component force-balance for measuring lift, drag, and side forces and roll, pitch and yaw moments. A 16-bit data acquisition system is used to gather data. The tunnel is also equipped with a turntable for yaw or angle of attack control for 2D or 3D testing and has a moveable XY traverse probe for mounting pitot-static probes or hot-wire anemometers.

Wind tunnel airfoil models were fabricated using foam, fiberglass and epoxy resin. For translational stage installation, a recess was routed in the trailing edge. Based on computational results and volume constraints, the tabs were installed and tested at 5% chord from the trailing edge. This location allowed for sufficient room for retracting the tabs without loosing the lift enhancement benefit. Fully retracted, the tabs were nearly flush with the surface of the airfoil. Fully extended, the tabs extended approximately 3 mm (1% of chord) perpendicular to the surface. This design allowed for minimum changes to current wing design and manufacturing techniques. Over 90% of the airfoil would remained unchanged with only modifications to the trailing edge region.

Analysis using computational fluid dynamics (CFD) codes greatly reduced the number of experimental runs and models needed. By studying the effects with and without the translational elements and the effects of varying height, location and width using simulated data, test model sizes and configurations were finalized.

A typical flow field in the trailing edge region with the separated, recirculating flow behind the translational element was observed. Despite the forward location, the translational element remained effective. The reason is that the point of flow separation for the entire airfoil essentially shifts from the trailing edge to the lower edge of the translational element.

Translational elements were scaled in accordance with model dimensions. Previous work showed that translational elements around 1% of the chord to be a good average size. With that as a starting size, computational simulations were performed using various tab configurations. To have sufficient volume for retraction, it was necessary to test the translational elements at various locations upstream of the trailing edge. It was found that the lift enhancement benefits of the translational elements were retained despite their forward location.

Figure 19:
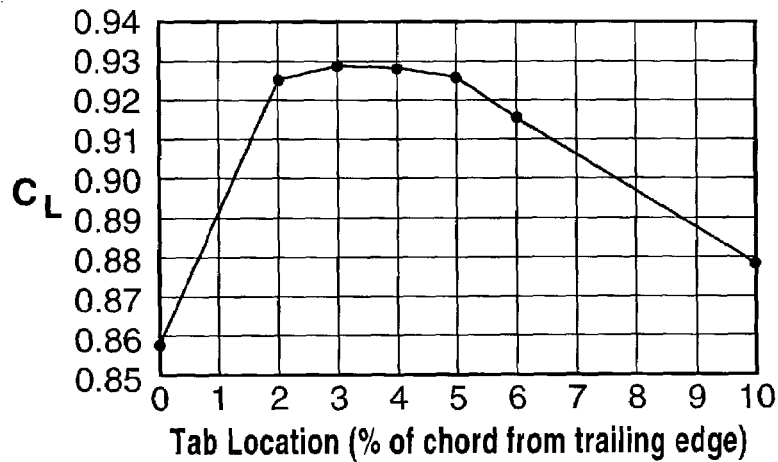
FIG. 19 is a graph showing the relationship between coefficient of lift, $C_L$, and translational element location in percent of chord from trailing edge for a GU25-5(11)-8 airfoil at an angle of attack $\alpha=0$ and $Re=1.0\times10^6$.
Figure 20:
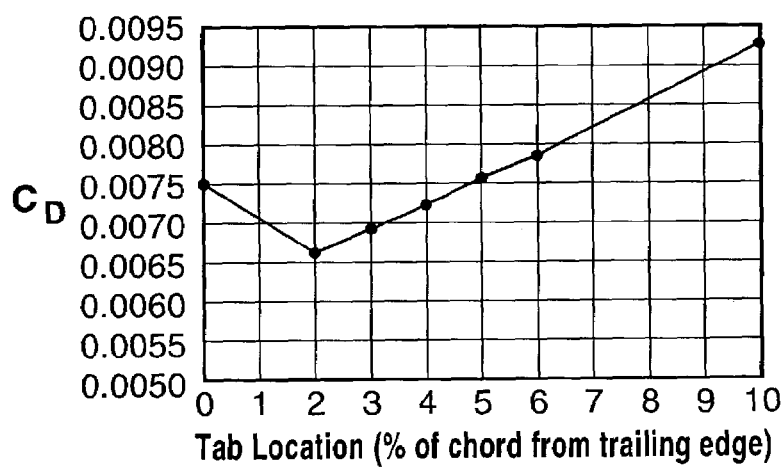
FIG. 20 is a graph showing the relationship between coefficient of drag, $C_D$, and translational element location in percent of chord from trailing edge for a GU25-5(11)-8 airfoil at an angle of attack $\alpha=0$ and $Re=1.0\times10^6$.
Figure 21:
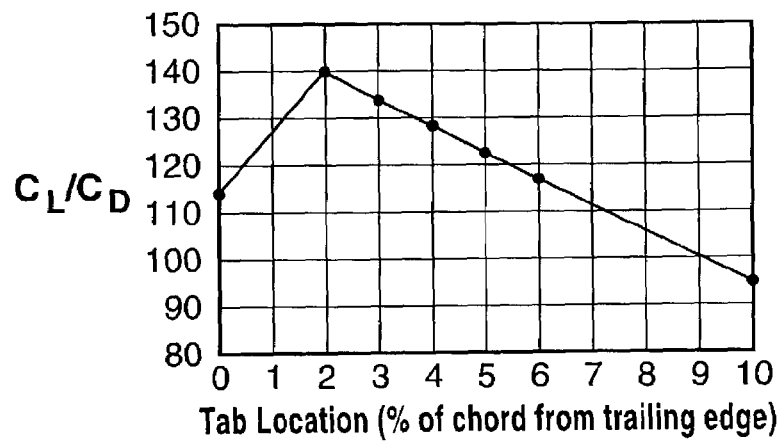
FIG. 21 is a graph showing the relationship between the ratio of coefficient of lift, $C_L$, to coefficient of drag, $C_D$, and translational element location in percent of chord from trailing edge for a GU25-5(11)-8 airfoil at an angle of attack $\alpha=0$ and $Re=1.0\times10^6$.
Figure 22:
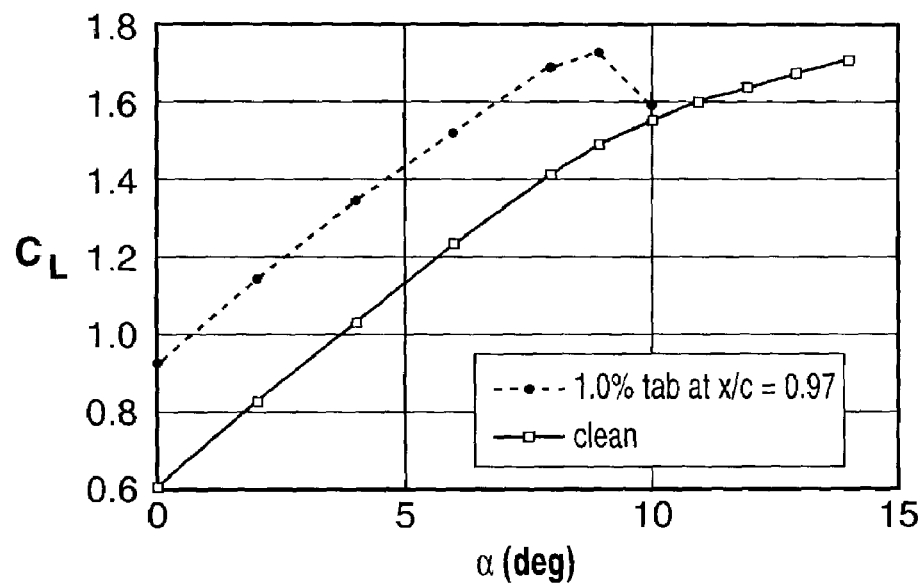
FIG. 22 is a graph showing the predicted relationship between coefficient of lift, $C_L$, and angle of attack, $\alpha$, for a GU25-5(11)-8 airfoil and $Re=1.0\times10^6$ with and without a translational element according to the invention.

To observe the effect of translational element position on performance, calculations were made with the translational elements positioned at the trailing edge (0%) and moved forward up to 10% of chord from the trailing edge. Note that with the translational elements simply placed at the trailing edge, $C_L$ increased from 0.613 to 0.858. FIG. 19 through FIG. 21 show the effect of position for a 1% translational element on lift, drag, and lift to drag ratio for the GU25-5 (11)-8 airfoil at an angle of attack $\alpha=0$ and $Re=1.0\times10^6$. Based on the results shown in FIG. 19, an effective zone for placing the translational elements on the test airfoil was determined to range from 2% to 6% of the aft portion of the chord with maximum $C_L$ benefit at around 3% chord. As expected, the coefficient of drag ($C_D$) steadily increases as the translational element is moved forward from the trailing edge) as shown in FIG. 20; however, the performance benefit gained terms of $C_L/C_D$ remains until the translational element was moved past 6% of chord where the drag penalties become significant as shown in FIG. 21. FIG. 22 shows a predicted shift in the lift curve by $\Delta C_L=0.3$ for the test airfoil with a 1% translational element placed at x/c=0.97.

Figure 23:
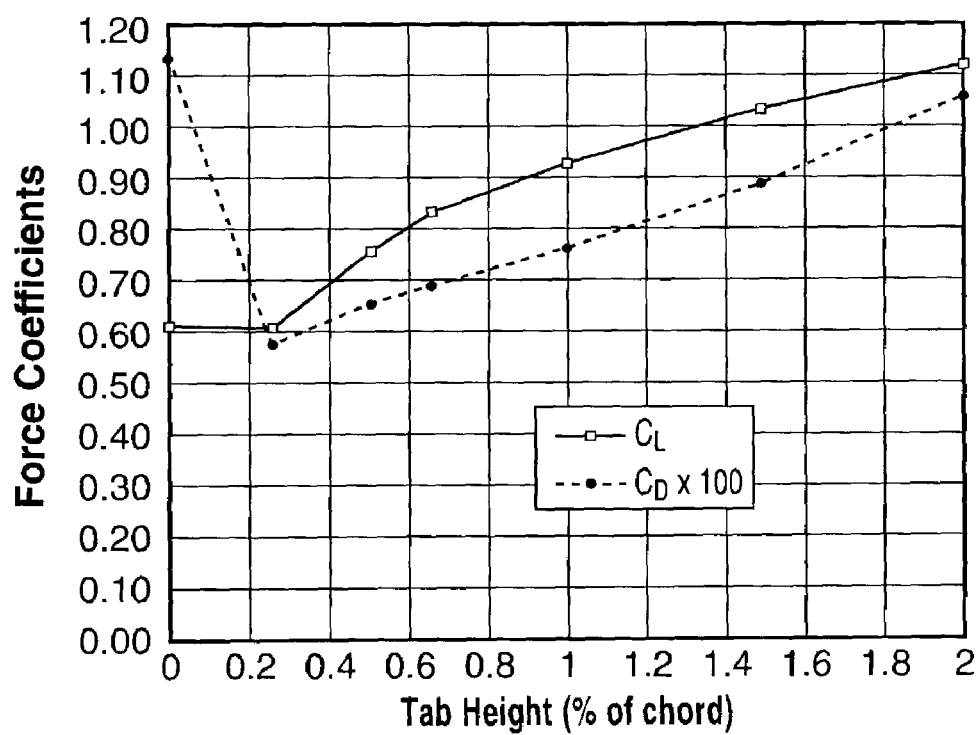
FIG. 23 is a graph showing the relationship between force coefficients and translational element height in percent of chord.

Similar results were generated for translational elements of differing heights as shown in FIG. 23. Translational elements over 2% chord in height did not seem to derive any further benefit in $C_L$, and in fact resulted in a noticeable increase in $C_D$. Based on simulation results, microfabrication and material properties, a final tab size of 1% (e.g., approximately 3 mm fully extended), positioned at 5% of chord upstream of the trailing edge was determined to be preferable.

Although the description above contains many specificities, these should not be construed as limiting the scope of the invention but as merely providing illustrations of some of the presently preferred embodiments of this invention. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for."

What is claimed is:

1. An apparatus for controlling aerodynamic loading of an airfoil surface, comprising:
   a base member; and
   a plurality of translational elements;
   said translational elements slidably coupled to said base member;
   said base member configured for installation in a trailing edge region of an airfoil wherein said translational elements are extendable and retractable in relation to said airfoil;
   wherein said translational elements have a length running substantially parallel to a trailing edge of said airfoil and are spaced apart from each other at a distance less than said length;
   wherein said translational elements are configured to control aerodynamic loading on said airfoil as a result of the orientation of said translational elements in the absence of a flap-type control surface on said airfoil.

2. An apparatus as recited in claim 1, wherein said translational element comprises a microfabricated tab.

3. An apparatus for controlling aerodynamic loading of an airfoil surface, comprising:
   a base member; and
   a translational element;
   said translational element slidably coupled to said base member;
   said base member configured for installation in a trailing edge region of an airfoil wherein said translational element is extendable and retractable in relation to said airfoil;
   wherein said translational element is coupled to said base member with a dovetail joint.

4. An apparatus as recited in claim 3, wherein said translational element comprises:
   an extension member; and
   a sliding member;
   said sliding member slidably coupled to said base member;
   said extension member fixedly coupled to sold sliding member.

5. An apparatus as recited in claim 4, wherein said extension member comprises a microfabricated tab.

6. An apparatus for controlling aerodynamic loading of an airfoil surface, comprising:
   a base member; and
   a translational element;
   said translational element slidably coupled to said base member;
   said base member configured for installation in a trailing edge region of an airfoil wherein said translational element is extendable and retractable in relation to said airfoil;
   wherein said translational element comprises
   (i) an extension member, and
   (ii) a sliding member,
   (iii) said sliding member slidably coupled to said base member,
   (iv) said extension member fixedly coupled to said sliding member;
   wherein said translational element is coupled to said base member with a dovetail joint.

7. An apparatus as recited in claim 6, wherein said translational element is extendable and retractable in a direction substantially perpendicular to the surface of said airfoil.

8. An apparatus for controlling aerodynamic loading, comprising:
   a base member;
   a plurality of sliding members; and
   said base member configured for installation in a trailing edge surface of an airfoil;
   said airfoil being without a flap-type control surface;
   wherein said sliding members are extendable and retractable from within said airfoil surface;
   wherein said sliding members have a length running substantially parallel to a trailing edge of said airfoil and are spaced apart from each other at a distance less than said length;
   wherein said sliding members are configured to control aerodynamic loading on said airfoil as a result of the orientation of said translational elements.

9. An apparatus as recited in claim 8, wherein said sliding members are adapted to increase or decrease lift as a result of a fully extended orientation of said sliding members.

10. An apparatus for controlling aerodynamic loading, comprising:
    a base member;
    a sliding member; and
    an extension member;
    said extension member bonded to said sliding member;
    said sliding member slidably coupled to said base member;
    said base member configured for installation in a trailing edge region of an airfoil wherein said extension member is extendable and retractable in relation to said airfoil;
    wherein said extension member is coupled to said base member with a dovetail joint.

11. An apparatus as recited in claim 10, wherein said extension member is extendable and retractable in a direction substantially perpendicular to the surface of said airfoil.

12. An apparatus for controlling aerodynamic loading, comprising:
- a microfabricated base member;
- a microfabricated sliding member; and
- a microfabricated extension member;
- said extension member bonded to said sliding member;
- said sliding member slidably coupled to said base member using a dovetail joint;
- said base member configured for installation in a trailing edge region of an airfoil wherein said extension member is extendable and retractable in relation to said airfoil.

13. An apparatus as recited in claim 12, wherein said extension member is extendable and retractable in a direction substantially perpendicular to the surface of said airfoil.

14. An apparatus for controlling aerodynamic loading, comprising:
- a base member;
- a plurality of translational elements; and
- means for slidably coupling said elements to said base member;
- said base member configured for installation in a trailing edge surface of an airfoil wherein said elements are extendable and retractable in relation to said airfoil;
- wherein said translational elements have a length running substantially parallel to a trailing edge of said airfoil and are spaced apart from each other at a distance less than said length;
- wherein said translational elements are configured to control aerodynamic loading on said airfoil as a result of the orientation of said translational elements in the absence of a flap-type control surface on said airfoil.

15. An apparatus as recited in claim 14, wherein translational elements are configured to extend and retract linearly outward from said airfoil surface.

16. An apparatus for controlling aerodynamic loading, comprising:
- a base member;
- a translational element; and
- means for slidably coupling said translational element to said base member;
- said base member configured for installation in a trailing edge region of an airfoil wherein said translational element is extendable and retractable in relation to said airfoil;
- wherein said means for slidably coupling said translational element to said base member comprises a dovetail joint.

17. An apparatus as recited in claim 16, wherein said translational element comprises:
- an extension member; and
- a sliding member;
- said sliding member slidably coupled to said base member;
- said extension member fixedly coupled to said sliding member.

18. An apparatus as recited in claim 17, wherein said extension member comprises a microfabricated tab.

19. An apparatus for controlling aerodynamic loading, comprising:
- a base member;
- a translational element; and
- means for slidably coupling said translational element to said base member;
- said base member configured for installation in a trailing edge region of an airfoil wherein said translational element is extendable and retractable in relation to said airfoil;
- wherein said translational element comprises
  - (i) an extension member, and
  - (ii) a sliding member,
  - (iii) said sliding member slidably coupled to said base member,
  - (iv) said extension member fixedly coupled to said sliding member;
- wherein said means for slidably coupling said translational element to said base member comprises a dovetail joint.

20. An apparatus as recited in claim 19, wherein said translational element is extendable and retractable in a direction substantially perpendicular to the surface of said airfoil.

21. An apparatus for controlling aerodynamic loading, comprising:
- a base member;
- a sliding member;
- an extension member;
- said extension member bonded to said sliding member; and
- means for slidably coupling said sliding member to said base member;
- said base member configured for installation in a trailing edge region of an airfoil wherein said extension member is extendable and retractable in relation to said airfoil;
- wherein said means for slidably coupling said sliding member to said base member comprises a dovetail joint.

22. An apparatus as recited in claim 21, wherein said extension member is extendable and retractable in a direction substantially perpendicular to the surface of said airfoil.

23. In an airfoil having a surface and a trailing-edge region, the improvement comprising:
- a plurality of translational elements embedded in the trailing-edge region of the airfoil;
- wherein said translational elements are extendable and retractable in relation to said airfoil;
- wherein said translational elements have a length running substantially parallel to a trailing edge of said airfoil and are spaced apart from each other at a distance less than said length;
- wherein said translational elements are configured to control aerodynamic loading on said airfoil surface as a result of the orientation of said translational elements in the absence of a flap-type control surface on said airfoil.

24. An improved airfoil as recited in claim 23:
- wherein said translational elements are slidably coupled to a base member.

25. An improved airfoil as recited in claim 24, wherein said a trailing-edge region terminates at a trailing edge of said airfoil; and
- wherein said translational elements are positioned a distance from said trailing edge;
- said distance being no greater than ten percent of the chord length of said airfoil.

26. In an airfoil having a surface and a trailing-edge region, the improvement comprising:
- a translational element embedded in the trailing-edge region of the airfoil;

wherein said translational element is extendable and retractable in relation to said airfoil;
wherein said translational element is slidably coupled to a base member;
wherein said translational element is coupled to said base member with a dovetail joint.

27. An improved airfoil as recited in claim 26, wherein said translational element comprises:
an extension member; and
a sliding member;
said sliding member slidably coupled to said base member;
said extension member fixedly coupled to said sliding member.

28. An improved airfoil as recited in claim 27, wherein said extension member comprises a microfabricated tab.

29. In an airfoil having a surface and a trailing-edge region, the improvement comprising:
a translational element embedded in the trailing-edge region of the airfoil;
wherein said translational element is extendable and retractable in relation to said airfoil,
wherein said translational element is slidably coupled to a base member;
wherein said translational element comprises
(i) an extension member, and
(ii) a sliding member,
(iii) said sliding member slidably coupled to said base member,
(iv) said extension member fixedly coupled to said sliding member;
wherein said translational element is coupled to said base member with a dovetail joint.

30. An apparatus as recited in claim 29, wherein said translational element is extendable and retractable in a direction substantially perpendicular to the surface of said airfoil.

31. In an airfoil having a surface and a trailing-edge region, the improvement comprising:
a plurality of spaced-apart translational elements embedded in the trailing-edge region of the airfoil;
said translational elements having a length running substantially parallel to a trailing edge of said airfoil and are spaced apart from each other at a distance less than said length
wherein said translational elements are extendible and retractable in relation to said airfoil;
wherein said translational elements are configured to control aerodynamic loading on said airfoil as a result of the orientation of said translational elements in the absence of a flap-type control surface on said airfoil.

32. An improved airfoil as recited in claim 31:
wherein said translational elements are configured to slidably extend and retract linearly outward from said airfoil surface.

33. An improved airfoil as recited in claim 32, wherein said translational elements span in a line across a majority of said airfoil in said trailing edge region.

34. In an airfoil having a surface and a trailing-edge region, the improvement comprising:
a plurality of spaced-apart translational elements embedded in the trailing-edge region of the airfoil;
wherein said translational elements are extendible and retractable in relation to said airfoil;
wherein said translational elements are slidably coupled to a base member;
wherein said translational elements are coupled to said base member with dovetail joints.

35. An improved airfoil as recited in claim 34, wherein each said translational element comprises:
an extension member; and
a sliding member;
said sliding member slidably coupled to said base member;
said extension member fixedly coupled to said sliding member.

36. An improved airfoil as recited in claim 35, wherein said extension member comprises a microfabricated tab.

37. In an airfoil having a surface and a trailing-edge region, the improvement comprising:
a plurality of spaced-apart translational elements embedded in the trailing-edge region of the airfoil;
wherein said translational elements are extendible and retractable in relation to said airfoil;
wherein each said translational element comprises
(i) an extension member, and
(ii) a sliding member,
(iii) said sliding member slidably coupled to said base member,
(iv) said extension member fixedly coupled to said sliding member;
wherein each said sliding member is coupled to said base member with a dovetail joint.

38. An apparatus as recited in claim 37, wherein said translational elements are extendable and retractable in a direction substantially perpendicular to the surface of said airfoil.

39. An airfoil having a surface and a trailing-edge region, and comprising a plurality of spaced-apart translational elements embedded in said trailing-edge region of said airfoil wherein said translational elements are extendible and retractable in relation to said airfoil, wherein said translational elements are have a length running substantially parallel to a trailing edge of said airfoil and are spaced apart from each other at a distance less than said length, and configured to control aerodynamic loading on said airfoil as a result of the orientation of said translational elements in the absence of a flap on said airfoil.

40. An airfoil as recited in claim 39:
wherein said translational elements are slidably coupled to a base member.

41. An airfoil as recited in claim 40, wherein said translational elements are deployed independently of any other control surface on said airfoil.

42. An airfoil having a surface and a trailing-edge region, and comprising a plurality of spaced-apart translational elements embedded in said trailing-edge region of said airfoil wherein said translational elements are extendible and retractable in relation to said airfoil;
wherein said translational elements are slidably coupled to a base member;
wherein said translational elements are coupled to said base member with dovetail joints.

43. An airfoil as recited in claim 42, wherein each said translational element comprises:
an extension member; and
a sliding member;
said sliding member slidably coupled to said base member;
said extension member fixedly coupled to said sliding member.

44. An airfoil as recited in claim 43, wherein said extension member comprises a microfabricated tab.

45. An airfoil having a surface and a trailing-edge region, and comprising a plurality of spaced-apart translational elements embedded in said trailing-edge region of said airfoil wherein said translational elements are extendible and retractable in relation to said airfoil;
  wherein each said translational element comprises
    (i) an extension member, and
    (ii) a sliding member,
    (iii) said sliding member slidably coupled to said base member,
    (iv) said extension member fixedly coupled to said sliding member;
  wherein each said sliding member is coupled to said base member with a dovetail joint.

46. An airfoil as recited in claim 45, wherein said translational elements are extendable and retractable in a direction substantially perpendicular to the surface of said airfoil.

47. An airfoil having a trailing-edge region and a chord length, and comprising:
  a plurality of spaced apart translational elements embedded in the trailing edge region of the airfoil;
  each said translational element configured for deployment outward from said trailing-edge region of said airfoil;
  each said translational element having a maximum height of approximately two percent of the chord length of the airfoil when said translational element is fully deployed;
  wherein said translational elements have a length running substantially parallel to a trailing edge of said airfoil and are spaced apart from each other at a distance less than said length;
  wherein said translational elements are configured to control aerodynamic loading on said airfoil as a result of the orientation of said translational element in the absence of a flap-type control surface on said airfoil.

48. An airfoil as recited in claim 47:
  wherein said translational elements are slidably coupled to a base member.

49. An airfoil as recited in claim 48, wherein said a trailing-edge region terminates at the trailing edge of said airfoil; and
  wherein said translational element is positioned a distance from said trailing edge;
  said distance being no greater than ten percent of the chord length of said airfoil.

50. An airfoil having a trailing-edge region and a chord length, and comprising:
  a plurality of spaced apart translational elements embedded in the trailing edge region of the airfoil;
  each said translational element configured for deployment outward from said trailing-edge region of said airfoil;
  each said translational element having a maximum height of approximately two percent of the chord length of the airfoil when said translational element is deployed;
  wherein said translational elements are slidably coupled to a base member;
  wherein said translational elements are coupled to said base member with dovetail joints.

51. An airfoil as recited in claim 50, wherein each said translational element comprises:
  an extension member; and
  a sliding member;
  said sliding member slidably coupled to said base member;
  said extension member fixedly coupled to said sliding member.

52. An airfoil as recited in claim 51, wherein said extension member comprises a microfabricated tab.

53. An airfoil having a trailing-edge region and a chord length, and comprising:
  a plurality of spaced apart translational elements embedded in the trailing edge region of the airfoil;
  each said translational element configured for deployment outward from said trailing-edge region of said airfoil;
  each said translational element having a maximum height of approximately two percent of the chord length of the airfoil when said translational element is deployed;
  wherein each said translational element comprises
    (i) an extension member, and
    (ii) a sliding member,
    (iii) said sliding member slidably coupled to said base member,
    (iv) said extension member fixedly coupled to said sliding member;
  wherein each said sliding member is coupled to said base member with a dovetail joint.

54. An airfoil as recited in claim 53, wherein said translational elements are extendable and retractable in a direction substantially perpendicular to the surface of said airfoil.

55. A method of controlling aerodynamic loading on an airfoil having a chord length, trailing edge and a trailing-edge region, the airfoil generating a point of airflow separation when the airfoil is employed in an airflow, the method comprising:
  slidably deploying a translational element linearly outward from said trailing-edge region of said airfoil;
  wherein said translational element is embedded at a distance no further than ten percent of the chord length from the trailing edge in the trailing-edge region of the airfoil; and
  shifting the point of airflow separation for a substantial portion of the airfoil from the trailing edge to a location on the translational element to control the lift of said airfoil.

56. A method as recited in claim 55, wherein said translational element is deployed in a direction substantially perpendicular to the surface of said airfoil.

57. A method of controlling aerodynamic loading on an airfoil having a chord length, trailing edge and a trailing-edge region, the airfoil generating a point of airflow separation when the airfoil is employed in an airflow, comprising:
  slidably deploying a plurality of spaced-apart translational elements linearly outward from said trailing-edge region of said airfoil;
  wherein said translational elements are embedded at a distance no further than ten percent of the chord length from the trailing edge in the trailing-edge region of the airfoil; and
  shifting the point of airflow separation for a substantial portion of the airfoil from the trailing edge to a location on the translational elements to control the lift of said airfoil.

58. A method as recited in claim 57, wherein said translational elements are deployed in a direction substantially perpendicular to the chord of said airfoil.

59. A method as recited in claim 57, wherein said airfoil has an upper surface and a lower surface, and wherein deploying a plurality of spaced-apart translational elements comprises deploying the translational elements downward from the lower surface of the airfoil to increase the lift of the airfoil.

60. A method as recited in claim 57, wherein said airfoil has an upper surface and a lower surface, and wherein deploying a plurality of spaced-apart translational elements comprises deploying the translational elements upward from the upper surface of the airfoil to decrease the lift of the airfoil.

61. A method as recited in claim 57, wherein each translational element is capable of variably extending to at least a portion of the translation element's extendable length.

62. A method as recited in claim 57, wherein each translational element is capable of independently extending and retracting in relation to said airfoil and each other.

63. An apparatus for controlling aerodynamic loading of an airfoil, said airfoil having a chord length and an upper and lower surface converging at a trailing edge, comprising:

a base member; and a translational element;

said translational element slidably coupled to said base member;

said base member configured to be embedded at a distance no further than ten percent of the chord length from the trailing edge in a trailing edge region of an airfoil;

wherein said translational element is extendable and retractable said airfoil;

wherein said translational element is configured to shift the point of airflow separation for a substantial portion of the airfoil from the trailing edge to a location on the translational elements to control the aerodynamic loading of said airfoil.

64. An apparatus as recited in claim 63, wherein the translation element is configured such that downward extension of said translational element outward from the lower surface increases the lift on said airfoil.

65. An apparatus as recited in claim 63, wherein the translation element is configured such that upward extension of said translational element outward from the upper surface decreases the lift on said airfoil.

66. An airfoil having upper and lower surfaces and a trailing-edge region, comprising:

a plurality of spaced-apart translational elements embedded in said trailing-edge region of said airfoil;

wherein said translational elements have a length running substantially parallel to a trailing edge of said airfoil and are spaced apart from each other at a distance less than said length;

wherein said translational elements am independently extendible and retractable in relation to said airfoil and each other to control aerodynamic loading on said airfoil in the absence of a flap-type control surface on said airfoil.

67. An airfoil as recited in claim 66, wherein said translational elements may be deployed in a serrated pattern to produce a variable trailing-edge geometry.

68. An airfoil as recited in claim 66, wherein said translational elements may be extended downward from said lower surface to increase lift on the airfoil.

69. An airfoil as recited in claim 66, wherein said translational elements may be extended upward from said upper surface to decrease lift on the airfoil.

70. An airfoil having a chord length, trailing-edge and a trailing-edge region, the airfoil generating a point of airflow separation when the airfoil is employed in an airflow, comprising:

a translational element embedded in said airfoil less than ten percent of the chord length from the trailing edge;

wherein said translational element is extendible and retractable linearly outward in relation to said airfoil;

wherein said translational element is positioned in said trailing-edge region of said airfoil such that extension of the translational element shifts the point of airflow separation for a substantial portion of the airfoil from the trailing edge to a location on the translational element;

wherein aerodynamic loading on said airfoil is controlled by said shift in the point of airflow separation.

71. An airfoil as recited in claim 70, wherein said translational element embedded in said airfoil at a distance ranging from two percent to six percent of the chord length from the trailing edge.

72. An airfoil having a trailing-edge and a trailing-edge region, the airfoil generating a point of airflow separation when the airfoil is employed in an airflow, comprising:

a translational element embedded in said airfoil;

wherein said translational element is extendible and retractable outward in relation to said airfoil;

wherein said translational element is positioned in said trailing-edge region of said airfoil such that extension of the translational element shifts the point of airflow separation from the trailing edge to a location on the translational element;

wherein lift on said airfoil is controlled by said shift in the point of airflow separation; and a base member configured for installation in the trailing-edge region of the airfoil;

wherein said translational element comprises:

an extension member; and a sliding member;

said sliding member slidably coupled to said base member;

said extension member fixedly coupled to said sliding member.

73. An airfoil as recited in claim 70, wherein:

said airfoil has an upper surface and a lower surface; and wherein the translational element is configured to be deployed downward from the lower surface of the airfoil to increase the lift on the airfoil.

74. An airfoil as recited in claim 70, wherein:

said airfoil has an upper surface and a lower surface; and wherein the translational element is configured to be deployed upward from the upper surface of the airfoil to decrease the lift on the airfoil.

75. An airfoil as recited in claim 70, wherein:

said airfoil has an upper surface and a lower surface; and wherein the translational element is configured to be deployed upward from the upper surface of the airfoil and downward from the lower surface of the airfoil to control the lift on the airfoil.

76. An airfoil as recited in claim 70, further comprising:

a second translational element embedded in said airfoil;

wherein said second translational element is independently extendible and retractable in relation to said airfoil and said first translational element.

77. An airfoil as recited in claim 70, wherein the translation element comprises a plurality of translational elements configured such that extension of the translational element shifts the point of airflow separation across substantially all of the airfoil.

78. An airfoil as recited in claim 70, wherein the translational element is configured to operate independently from any other control surface on said airfoil.

79. An airfoil as recited in claim 70, wherein the translational element is configured to operate in the absence of a flap-type control surface on said airfoil.

80. An airfoil as recited in claim 70, wherein the translational element is configured to operate in the absence of an aileron on said airfoil.

81. An airfoil as recited in claim 70, wherein the translational element is configured to operate in the absence of a flap on said airfoil.

82. An airfoil as recited in claim 70, wherein the translational element has a maximum height of approximately two percent of the chord length of the airfoil when said translational element is deployed.

* * * * *